(12) United States Patent
Takamatsu et al.

(10) Patent No.: US 7,626,825 B2
(45) Date of Patent: Dec. 1, 2009

(54) OPTICAL TRANSMITTER MODULE

(75) Inventors: Hisashi Takamatsu, Yokohama (JP); Takeshi Yamashita, Ninomiya (JP); Hideyuki Kuwano, Fujisawa (JP); Osamu Kagaya, Tokyo (JP); Hiroyuki Arima, Yokohama (JP)

(73) Assignee: Opnext Japan, Inc., Kanagawa (JP)

( * ) Notice: Subject to any disclaimer, the term of this patent is extended or adjusted under 35 U.S.C. 154(b) by 148 days.

(21) Appl. No.: 12/003,225

(22) Filed: Dec. 20, 2007

(65) Prior Publication Data

US 2008/0196929 A1 Aug. 21, 2008

(30) Foreign Application Priority Data

Feb. 15, 2007 (JP) .............................. 2007-034962

(51) Int. Cl.
*H05K 1/00* (2006.01)
(52) U.S. Cl. .................... 361/749; 361/794; 361/795; 174/254
(58) Field of Classification Search ......... 361/749–750, 361/792–795; 174/254–258
See application file for complete search history.

(56) References Cited

U.S. PATENT DOCUMENTS

| 6,617,518 | B2 * | 9/2003 | Ames et al. ................. 174/254 |
| 6,932,518 | B2 * | 8/2005 | Greenlaw ..................... 385/88 |
| 6,985,659 | B2 * | 1/2006 | Torigoe et al. .............. 385/114 |

FOREIGN PATENT DOCUMENTS

JP 2003-110207 4/2003

* cited by examiner

*Primary Examiner*—Tuan T Dinh
(74) *Attorney, Agent, or Firm*—McDermott Will & Emery LLP

(57) ABSTRACT

An optical transmitter module is described. The optical transmitter module includes a lead pin for electrically connecting the inside and outside of a housing, and a flexible printed circuit board connected to the lead pin. The flexible printed circuit board has a signal pattern and two ground conductor patterns to be connected to an optical modulation element, a laser terminal pattern to be connected to a semiconductor laser, a Peltier terminal pattern to be connected to a Peltier element, and two covering conductive layers in addition to a layer on which such patterns are formed. The covering conductive layers cover all the patterns except for the signal pattern.

8 Claims, 5 Drawing Sheets

FIG. 1 —PRIOR ART—

OPTICAL TRANSMITTER MODULE

CLAIM OF PRIORITY

The present application claims priority from Japanese patent application serial no. 2007-034962, filed on Feb. 15, 2007, the content of which is hereby incorporated by reference into this application.

BACKGROUND OF THE INVENTION

The present invention relates to an optical transmitter module, and more particularly to an optical transmitter module using a flexible printed circuit board having flexibility to output a high frequency signal.

Optical transmitter modules include a direct modulation optical transmitter module and an electro-absorption modulation optical transmitter module. With the direct modulation, an electrical signal input from the outside is provided to a laser diode (hereinafter referred to as LD) and then an optical signal is output. With the EA modulation, an electrical signal is provided to an electro-absorption modulator (hereinafter referred to as EA modulator element) that modulates the laser beam output from the LD, and then an optical signal is output.

Recently the optical transmission modules have been miniaturized and integrated, due to the demand for reduction in power consumption and costs in addition to the increase in the data transmission speed. Further, the miniaturized optical transmitter module has been mounted on a transceiver, often by means of a flexible printed circuit board as a means for electrically connecting the inside and outside of the housing of the optical transmitter module in order to absorb the difference in the package configuration.

However, in the case of such an optical transmitter module using the flexible printed circuit board, the electrical signal propagates through a signal line of the flexible printed circuit board and thus the output optical signal is degraded. FIG. 1 shows frequency characteristics (S21) of the light output of the optical transmitter module to which the flexible printed circuit board is used. As shown in (a) of FIG. 1, there is a region in which the energy loss increases in the frequency response in a band of several GHz, and in which a dip appears with a depth of not less than 1 dB. At this time, in the output waveform (eye pattern), fluctuation (jitter) occurs in a time direction depending on the frequency response and the output amplitude is distorted. As a result, the eye opening is reduced.

The flexible printed circuit board includes a laser terminal pattern for supplying a drive current to the LD, a Peltier terminal pattern for supplying a current to a Peltier element, and the like, in addition to a signal pattern through which the transmitted electrical signal propagates. It is assumed that the dip appears due to the interaction between the signal pattern and the other patterns running alongside in the flexible printed circuit board.

Thus, a method of forming a shield can generally be used as an anti-dip measure. The method of forming a shield over the flexible printed circuit board is often used as an anti-noise measure in the module using the flexible printed circuit board. JP-A No. 2003-110207 describes a technology in which a shield is provided over the entire surface of the flexible printed circuit board. In fact, as shown in (b) of FIG. 1, the frequency characteristics are significantly improved when the flexible printed circuit board is shielded by conductors in the optical transmitter module.

In a method of shielding the transmission line by conductors, which is generally used as an anti-EMI measure, it is necessary for the signal pattern of the flexible printed circuit board to have a characteristic impedance of about 50Ω. For example, with a configuration in which the entire surfaces of the flexible printed circuit board are covered by conductive layers, generally the thickness of the flexible printed circuit board is not less than 500 μm due to the manufacturing limitation of the signal pattern (the minimum dimension: 50 μm). This leads not only to a loss of flexibility but also to a disadvantage in terms of manufacturing costs and manufacturing accuracy of the patterns.

SUMMARY OF THE INVENTION

The present invention provides an optical transmitter module having excellent frequency characteristics and using a flexible printed circuit board with flexibility for input and output.

The above object can be achieved by an optical transmitter module including a housing that houses a semiconductor laser element and an optical modulation element for modulating a laser beam by an electrical signal; lead pins for electrically connecting the inside and outside of the housing; and a flexible printed circuit board connected to the lead pins. The flexible printed circuit board includes a signal pattern to be connected to the optical modulation element; first and second ground conductor patterns provided on both sides of the signal pattern; a third ground conductor pattern provided on the back side of the signal pattern; a first insulating layer for covering the signal pattern as well as the first and second ground conductor patterns; a second insulating layer for covering the third ground conductor pattern; a first covering conductive layer for covering the first insulating layer; and a second covering conductive layer for covering the second insulating layer. The first covering conductive layer at least has a slit formed over the portion of the signal pattern.

Further, the above object can be achieved by an optical transmitter module including a housing that houses a semiconductor laser element for modulating a laser beam by an electrical signal; lead pins for electrically connecting the inside and outside of the housing; and a flexible printed circuit board connected to the lead pins. The flexible printed circuit board includes a signal pattern to be connected to the optical modulation element; first and second ground conductor patterns provided on both sides of the signal pattern; a third ground conductor pattern provided on the back side of the signal pattern; a first insulating layer for covering the signal pattern as well as the first and second ground conductor patterns; a second insulating layer for covering the third ground conductor pattern; a first covering conductive layer for covering the first insulating layer; and a second covering conductive layer for covering the second insulating layer. The first covering conductive layer at least has a slit formed over the portion of the signal pattern.

BRIEF DESCRIPTION OF THE DRAWINGS

Preferred embodiments of the present invention will now be described in conjunction with the accompanying drawings, in which.

DESCRIPTION OF THE PREFERRED EMBODIMENTS

Figure 1:
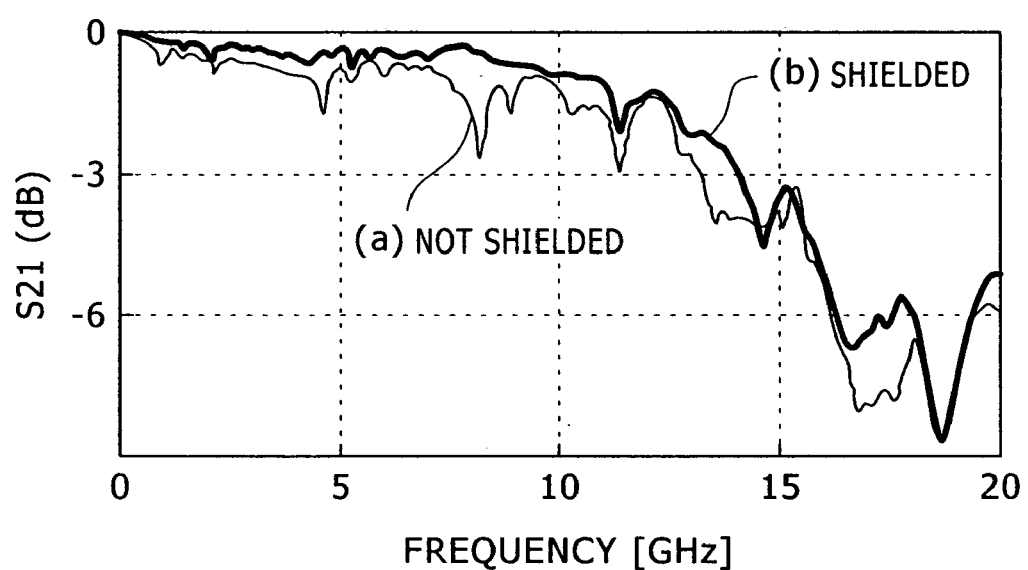
FIG. 1 is a diagram showing the improvement of the frequency characteristics when a covering conductive layer is provided on a flexible printed circuit board.

Hereinafter preferred embodiments will be described with reference to accompanying drawings. Substantially like parts are denoted by like reference numerals and the description will not be repeated here.

First Embodiment

Figure 2:
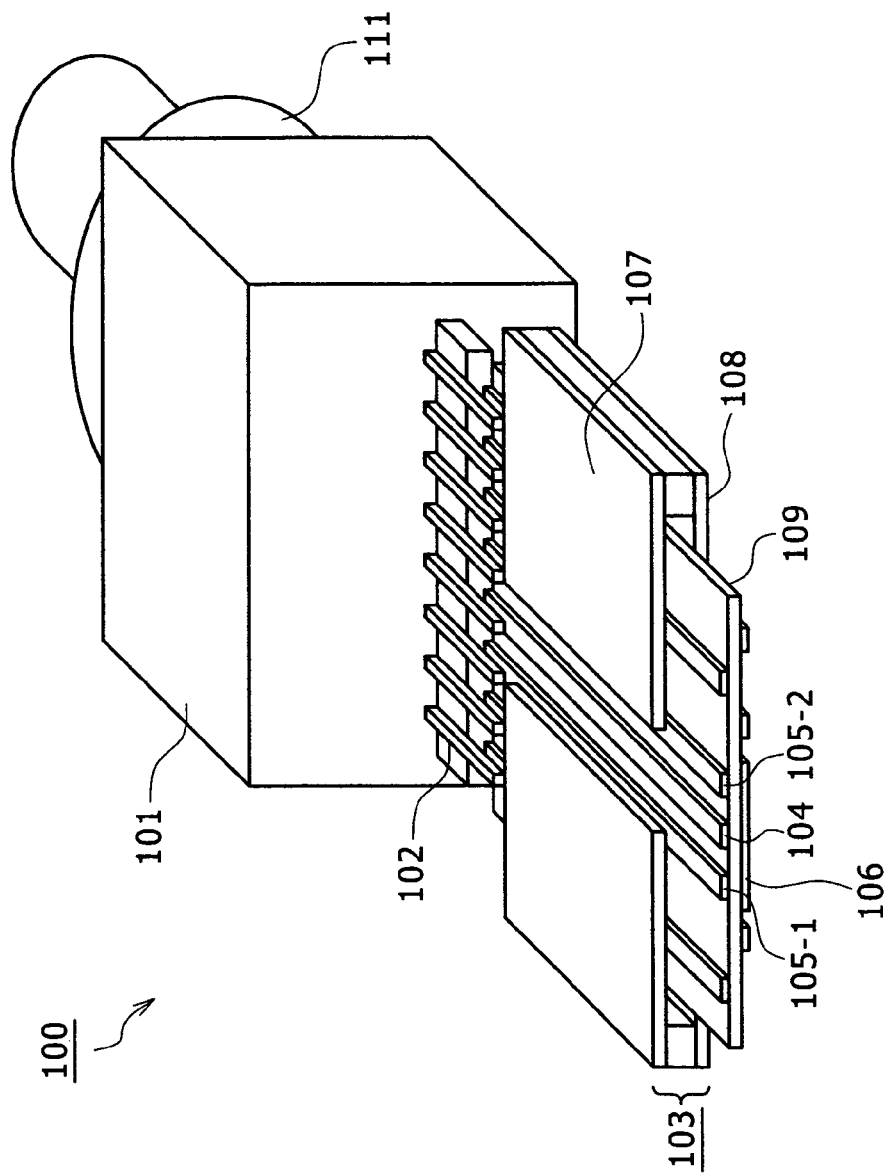
FIG. 2 is a perspective view of an optical transmitter module.
Figure 3:
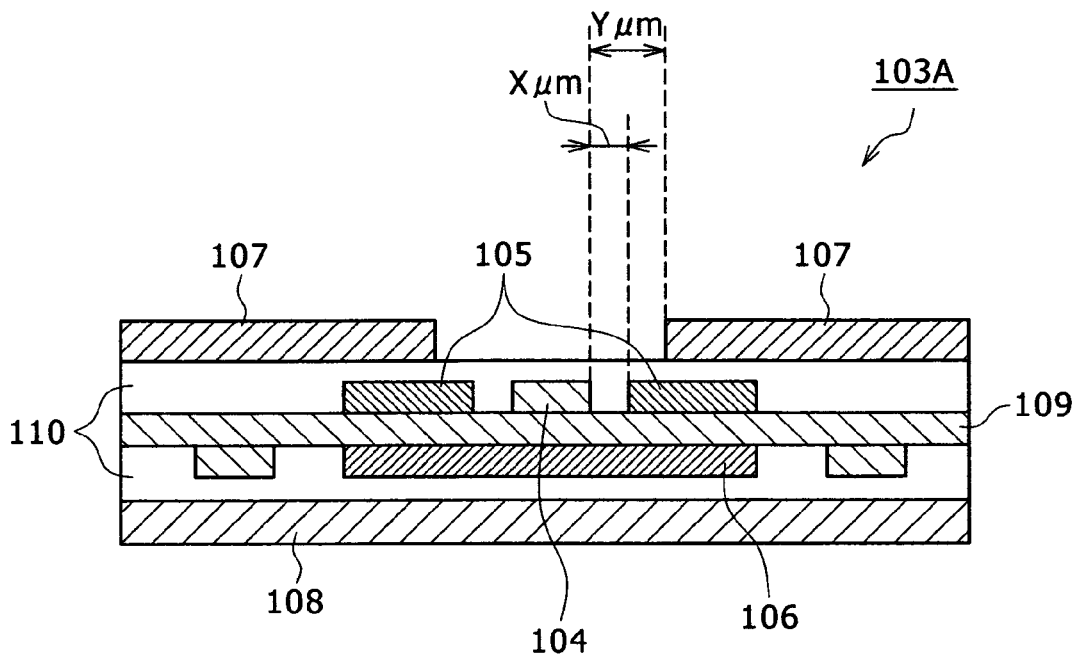
FIG. 3 is a cross-sectional view of a flexible printed circuit board.
Figure 4:
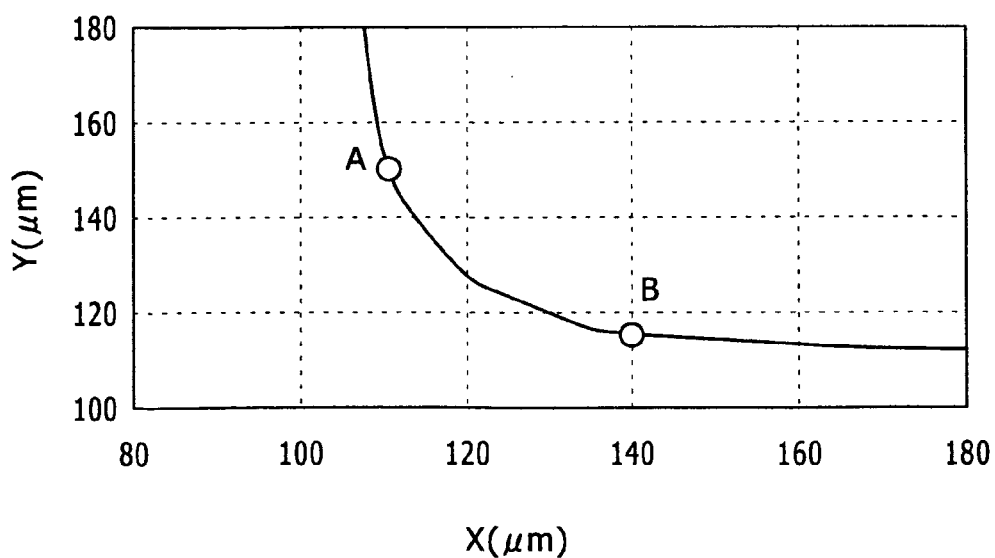
FIG. 4 is a diagram showing the relationship between the X dimension and the Y dimension with an impedance of 50Ω.
Figure 5:
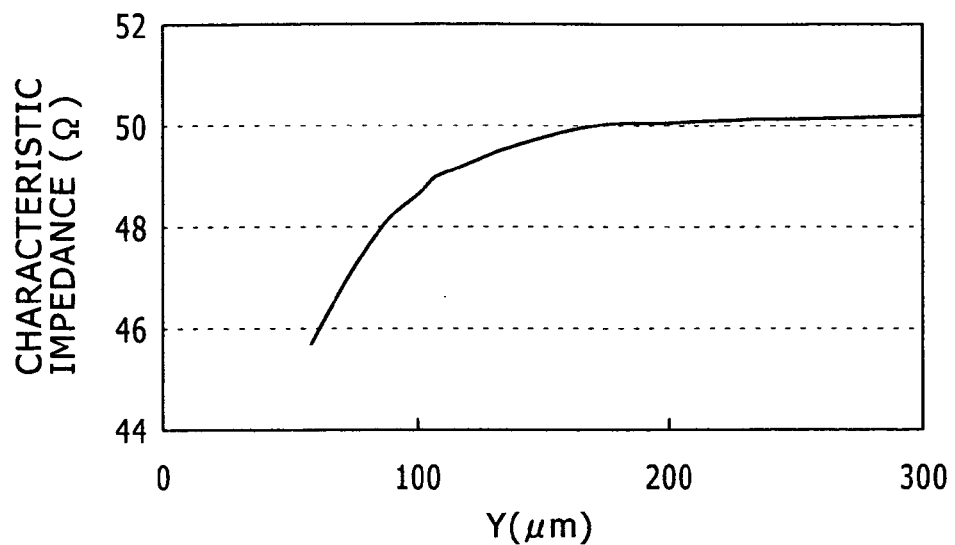
FIG. 5 is a diagram showing the relationship between the Y dimension and the characteristic impedance.
Figure 6:
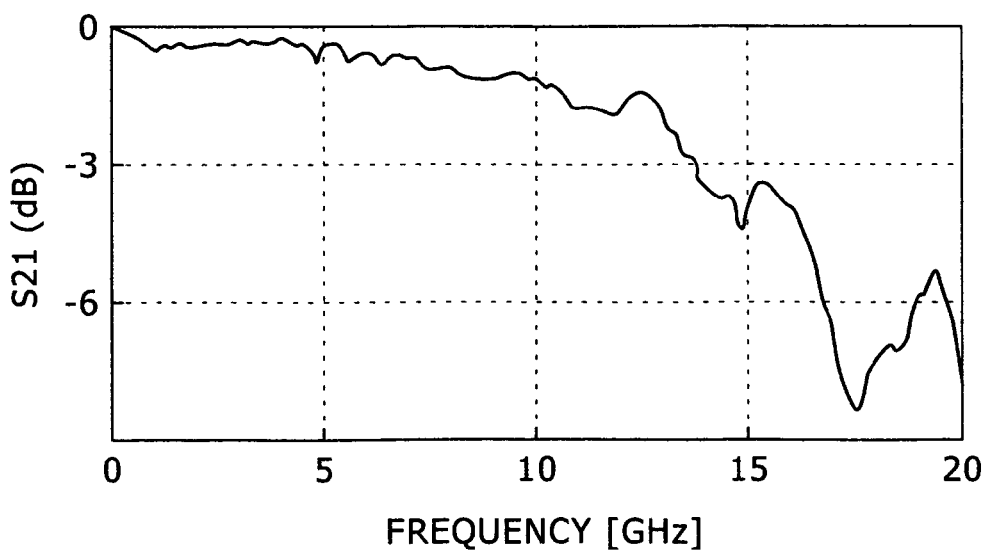
FIG. 6 is a diagram showing the frequency characteristics.

A first embodiment will be descried with reference to FIGS. 2 to 6. Here, FIG. 2 is a perspective view of an optical transmitter module. FIG. 3 is a cross-sectional view of a flexible printed circuit board. FIG. 4 is a diagram showing the relationship between the X dimension and the Y dimension with an impedance of 50Ω. FIG. 5 is a diagram showing the relationship between the Y dimension and the characteristic impedance. FIG. 6 is a diagram showing the frequency characteristics.

In FIG. 2, an optical transmitter module 100 includes a housing 101 that houses an LD, a Peltier element, a thermistor, optical components and the like, which are not shown in the figure; a flexible printed circuit board 103 connected to lead pins 102 that extend from an end of the housing 101 and are arranged vertically in two rows; and a ferrule 111 attached to the other end of the housing 101. The optical transmitter module 100 transmits an optical signal from the ferrule 111 based on an electrical signal from the flexible printed circuit board 103.

The flexible printed circuit board 103 is configured such that wirings 104 to 106 are formed on both sides of an insulating substrate 109, in which an insulating layer 110 (not shown) is formed on both sides thereof, and covering conductive layers 107, 108 are further formed on both sides of the insulating layer. Ground conductor patterns 105 are provided on both sides of the signal pattern 104. Further, a broad ground conductor pattern 106 is provided on the back side of the insulating substrate of a ground conductor pattern 105-1, signal pattern 104, and ground conductor pattern 105-2. Although the covering conductive layer 108 on the back side of the signal pattern 104 is a solid pattern, the covering conductive layer 107 on the side of the signal pattern 104 has a slit-like opening over the portion of the signal pattern 104. Also shown, but not numbered, are wiring patterns such as a laser terminal pattern for supplying a drive current to the LD, a Peltier terminal pattern for supplying a current to the Peltier element, and a monitor pattern for the thermistor. Further, the covering conductive layers 107, 108 may float electrically. Still further, the LD may be a semiconductor laser diode in which a modulator is integrated.

In FIG. 3, a flexible printed circuit board 103A has plural patterns, including the signal pattern 104, formed on the insulating substrate 109, both sides of which are entirely covered by the insulating layer 110. This is the general configuration of the flexible printed circuit board. The signal pattern 104 and the ground conductor patterns 105 form a coplanar line. The signal pattern 104 and the ground conductor pattern 106 form a microstrip line. Further, the covering conductive layers 107, 108 are attached and formed on the insulating layer 110. Still further, the covering conductive layer 107 has an opening along the extensional direction of the signal pattern 104.

In the present specification, the distance between the signal pattern 104 and the ground conductor pattern 105 is represented by Xμm, and the distance between the signal pattern 104 and the end of the covering conductive layer 107 on the signal pattern side is represented by Yμm. Now, the relationships of the dimensions and the characteristics will be described with reference to FIGS. 4 to 6.

In the first embodiment, the relationship between X and Y is defined as X<Y. FIG. 4 shows the relationship between the X dimension and the Y dimension with a characteristic impedance of 50Ω in the signal pattern 104, generally when the flexible printed circuit board is manufactured as thin as possible. FIG. 3 shows the configuration at A point in FIG. 4. According to the first embodiment, the positional relationship between the signal pattern 104 and the ground conductor pattern 106 dominates the characteristic impedance of the signal pattern 104, and thus the accuracy of Y is moderated. FIG. 5 shows the relationship of the characteristic impedance relative to Y, in relation to the typical dimension in the configuration of FIG. 3. Reduction of the Y dimension leads to significant reduction of the characteristic impedance relative to the signal pattern 104. Thus, in this case, the covering conductive layer 107 is formed so as to be Y>150 μm, in order to provide the consistency of the characteristic impedance. Incidentally, the ground conductor patterns 105, 106 and the covering conductive layers 107, 108 may be conducted through VIA (via hole) and the like.

By providing the covering conductive layers 107, 108, the electromagnetic noise due to the flexible printed circuit board is suppressed, and the dip is reduced and disappears, so that better frequency characteristics can be achieved. Generally, it is possible to obtain the highest shielding effect when the covering conductive layer is provided over the entire surface of the flexible printed circuit board. However, in the optical transmitter module, it is assumed that the dip appears in the frequency characteristics due to the interaction with the other patterns (e.g., the laser terminal pattern, the Peltier terminal pattern) that run alongside in the flexible printed circuit board. For this reason, a sufficiently high shielding effect can be obtained by covering all the patterns excluding the signal pattern. When such a covering is provided, as shown in FIG. 6, better frequency characteristics can be obtained as compared to (a) of FIG. 1. The effect of the improvement of the characteristics is significant when the bit rate of the electrical signal propagating through the signal pattern 104 is not less than 9.95 Gbits/s.

The newly provided covering conductive layer 107 is not located in the vicinity of the signal pattern 104, so that the impedance of the signal pattern 104 is not significantly reduced. Thus, it is possible to provide the consistency of the characteristic impedance of the signal pattern 104 without increasing the thickness of the flexible printed circuit board. As described above, when the covering conductive layer 107 is provided, it is possible to easily adjust the characteristic impedance of the signal pattern 104 to 50Ω, by keeping a given relationship between the distance between the signal pattern 104 and the ground conductor pattern 105 in the layer direction, and the distance between the signal pattern 104 and the end of the covering conductive layer 107 on the signal pattern side in the layer direction.

Further, the layers having the respective patterns and the covering conductive layers are manufactured in separate processes. In this way, it is possible to manufacture the layers having the respective patterns with an accurate characteristic impedance of the signal line. Further, it is possible to manufacture the covering conductive layers at low cost because of its simple structure, and to easily minimize the thickness of the covering conductive layers, thereby providing an advantage in terms of manufacturing costs and flexibility of the board.

Second Embodiment

Figure 7:
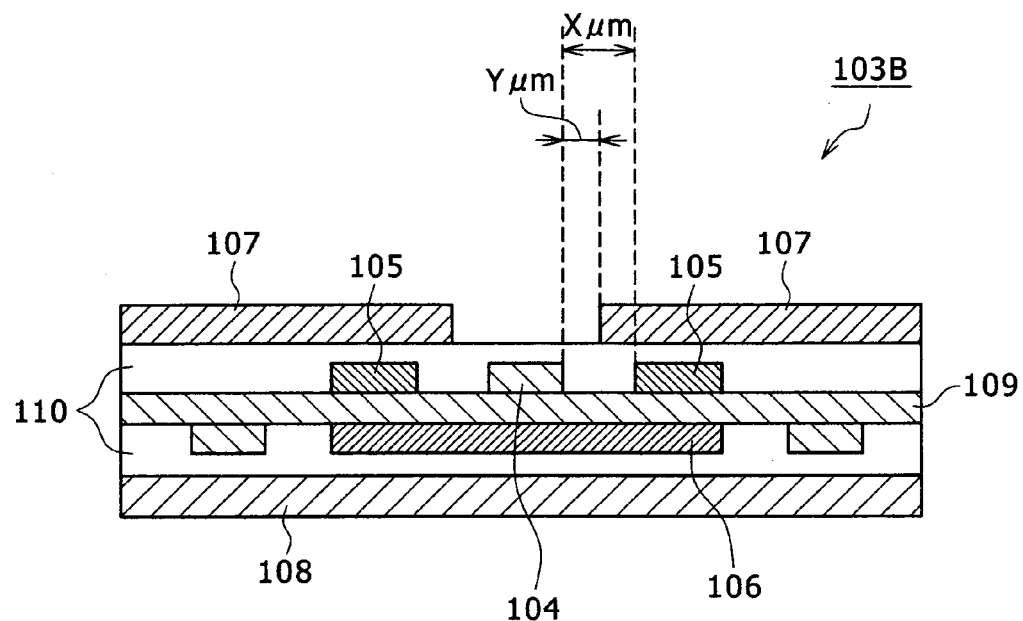
FIG. 7 is a cross-sectional view of a flexible printed circuit board.

A second embodiment will be described with reference to FIG. 7. Here, FIG. 7 is a cross-sectional view of a flexible printed circuit board.

In the second embodiment, the relationship between the X dimension and the Y dimension in a flexible printed circuit board 103B is defined as X>Y. This shows the configuration at B point in FIG. 4. Generally, the shielding effect increases when the covering conductive layers are provided as widely as possible. Thus, according to the second embodiment, the region (slit width) not covered by the conductive layer can be minimized by reducing Y as much as possible, and thus better shielding effect can be obtained. Further, the ground conductor patterns 105, 106 and the covering conductive layers 107, 108 may be conducted through VIA (via hole) and the like.

Third Embodiment

Figure 8:
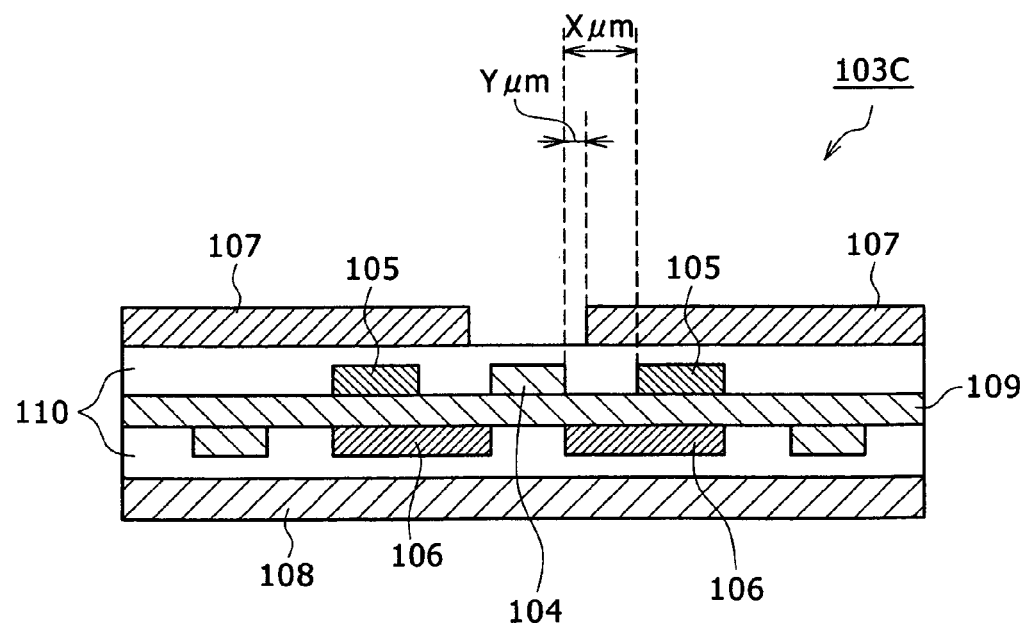
FIG. 8 is a cross-sectional view of another flexible printed circuit board.

A third embodiment will be described with reference to FIG. 8. Here, FIG. 8 is a cross-sectional view of a flexible printed circuit board.

In the third embodiment, similarly to the second embodiment, the relationship between the X dimension and the Y dimension in a flexible printed circuit board 103C is defined as X>Y. However, in the third embodiment, as shown in FIG. 8, the ground conductor pattern 106 is divided into two sections so as to be isolated from the signal pattern 104. In this way, the influence of the ground conductor pattern 106 to the characteristic impedance is reduced, and thus it is possible to further reduce the Y dimension smaller than in the second embodiment. As a result, better shielding effect can be obtained. Further, the ground conductor patterns 105, 106 and the covering conductive layers 107, 108 may be conducted through VIA (via hole) and the like.

Since the mechanism of the appearance of the dip is due to the interaction between the signal pattern and the other patterns running alongside, the same effect as in the case of forming a shield over the signal pattern can be obtained by forming a shield over the other patterns running alongside and being subjected to the interaction.

Thus, according to the present invention, it is possible to provide an optical transmitter module having excellent frequency characteristics and using a flexible printed circuit board with flexibility for input and output.

What is claimed is:

1. An optical transmitter module comprising:
a housing that houses a semiconductor laser element, and an optical modulation element for modulating a laser beam by an electrical signal;
lead pins for electrically connecting the inside and outside of the housing; and
a flexible printed circuit board connected to the lead pins, wherein said flexible printed circuit board includes:
a signal pattern to be connected to the optical modulation element;
first and second ground conductor patterns provided on both sides of the signal pattern;
a third ground conductor pattern provided on the back side of the signal pattern;
a first insulating layer for covering the signal pattern as well as the first and second ground conductor patterns;
a second insulating layer for covering the third ground conductor pattern;
a first covering conductive layer for covering the first insulating layer; and
a second covering conductive layer for covering the second insulting layer, and
wherein said first covering conductive layer at least has a slit formed over the portion of the signal pattern.

2. The optical transmitter module according to claim 1, wherein said bit rate of the electrical signal propagating through the signal pattern is not less than 9.95 Gbits/s.

3. The optical transmitter module according to claim 1, wherein said signal pattern and the third ground conductor pattern form a microstrip line.

4. The optical transmitter module according to claim 1, wherein said signal pattern and the first and second ground conductor patterns form a coplanar line.

5. An optical transmitter module comprising:
a housing that houses a semiconductor laser element for modulating a laser beam by an electrical signal;
lead pins for electrically connecting the inside and outside of the housing; and
a flexible printed circuit board connected to the lead pins, wherein said flexible printed circuit board includes:
a signal pattern to be connected to the optical modulation element;
first and second ground conductor patterns provided on both sides of the signal pattern;
a third ground conductor pattern provided on the back side of the signal pattern;
a first insulating layer for covering the signal pattern as well as the first and second ground conductor patterns;
a second insulating layer for covering the third ground conductor pattern;
a first covering conductive layer for covering the first insulating layer; and
a second covering conductive layer for covering the second insulating layer, and
wherein said first covering conductive layer at least has a slit formed over the portion of the signal pattern.

6. The optical transmitter module according to claim 5, wherein said bit rate of the electrical signal propagating through the signal pattern is not less than 9.95 Gbits/s.

7. The optical transmitter module according to claim 5, wherein said signal pattern and the third ground conductor pattern form a microstrip line.

8. The optical transmitter module according to claim 5, wherein said signal pattern and the first and second ground conductor patterns form a coplanar line.

* * * * *